(12) United States Patent
Zopf (10) Patent No.: US 8,340,977 B2
(45) Date of Patent: Dec. 25, 2012

(54) COMPENSATION TECHNIQUE FOR AUDIO DECODER STATE DIVERGENCE

(75) Inventor: Robert W. Zopf, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 903 days.

(21) Appl. No.: 12/436,472

(22) Filed: May 6, 2009

(65) Prior Publication Data
US 2009/0281815 A1 Nov. 12, 2009

Related U.S. Application Data

(60) Provisional application No. 61/051,560, filed on May 8, 2008.

(51) Int. Cl.
*G10L 19/00* (2006.01)
*G10L 21/02* (2006.01)
(52) U.S. Cl. .......................... 704/501; 704/228; 704/230
(58) Field of Classification Search .................. None
See application file for complete search history.

(56) References Cited

U.S. PATENT DOCUMENTS 6,400,296 B1 * 6/2002 Haartsen et al. ............. 341/143
8,000,960 B2 * 8/2011 Chen et al. .................. 704/219

OTHER PUBLICATIONS

Mytri, V.D.; Shivaprasad, A.P.; , "Improving the dynamic range of a CVSD coder," Electronics Letters , vol. 22, No. 8, pp. 429-430, Apr. 10, 1986.*
Nour-Eldin, A.H.; Tolba, H.; O'Shaughnessy, D.; , "Automatic recognition of Bluetooth speech in 802.11 interference and the effectiveness of insertion-based compensation techniques," Acoustics, Speech, and Signal Processing, 2004. Proceedings. (ICASSP '04). IEEE International Conference on , vol. 1, No., pp. I-1033-6 vol. 1, May 17-21, 2004.*
Liu, C.H.; , "Parameters-based speech packet recovery of adaptive CVSD for wireless PCN applications," Communication Systems, 2002. ICCS 2002. The 8th International Conference on , vol. 2, No., pp. 995-999 vol. 2, Nov. 25-28, 2002.*

* cited by examiner

*Primary Examiner* — Brian Albertalli
(74) *Attorney, Agent, or Firm* — Fiala & Weaver P.L.L.C.

(57) ABSTRACT

A system and method is described for compensating for the effects of a corrupted Continuously Variable Delta Slope Modulation (CVSD) decoder memory state on a decoded audio signal. In accordance with the system and method, a first estimated step size associated with a first frame of the decoded audio signal is calculated and a second estimated step size associated with a replacement frame generated to conceal bit errors in the first frame of the decoded audio signal is calculated. At least a second frame of the decoded audio signal is then modified based on the first estimated step size and the second estimated step size.

23 Claims, 8 Drawing Sheets

COMPENSATION TECHNIQUE FOR AUDIO DECODER STATE DIVERGENCE

CROSS-REFERENCE TO RELATED APPLICATIONS

This application claims priority to U.S. Provisional Patent Application No. 61/051,560, filed May 8, 2008, the entirety of which is incorporated by reference herein.

BACKGROUND OF THE INVENTION

1. Field of the Invention

The invention generally relates to systems and methods for improving the quality of an audio signal received within an audio communications system.

2. Background

In audio coding (sometimes called "audio compression"), a coder encodes an input audio signal into a digital bit stream for transmission. A decoder decodes the bit stream into an output audio signal. The combination of the coder and the decoder is called a codec. The transmitted bit stream is usually partitioned into frames, and in packet transmission networks, each transmitted packet may contain one or more frames of a compressed bit stream.

In many audio communications systems, bit errors may be introduced into the bit stream during transmission from the encoder to the decoder. Such bit errors may be random or bursty in nature. Generally speaking, random bit errors have an approximately equal probability of occurring over time, whereas bursty bit errors are more concentrated in time. Some codecs are more resilient to bit errors than others. For example, some codecs, such as CVSD (Continuously Variable Slope Delta Modulation), were designed with bit error resiliency in mind. With CVSD, the quality of the decoded audio output signal degrades gracefully as the occurrence of random bit errors increases.

CVSD is a delta modulation technique with a variable step size that was first proposed by J. A. Greefkes and K. Riemens in "Code Modulation with Digitally Controlled Companding for Speech Transmission," Philips Tech. Rev., pp. 335-353 (1970), the entirety of which is incorporated by reference herein. CVSD encodes at 1 bit per sample. For example, CVSD can be used to encode audio sampled at 64 kilohertz (kHz) at 64 kilobits/second (kbit/s).

In CVSD, the encoder maintains a reference sample and a step size. Each input sample is compared to the reference sample. If the input sample is larger, the encoder emits a "1" bit and adds the step size to the reference sample. If the input sample is smaller, the encoder emits a "0" bit and subtracts the step size from the reference sample. The CVSD encoder also keeps the previous K bits of output (K=3 or K=4 are very common) to determine adjustments to the step size; if J of the previous K bits are all 1s or 0s (J=3 or J=4 are also common), the step size is increased by a fixed amount. Otherwise, the step size remains the same (although it may be multiplied by a decay factor which is slightly less than 1). The step size is adjusted for every input sample processed.

A CVSD decoder reverses this process, starting with the reference sample, and adding or subtracting the step size according to the bit stream. The sequence of adjusted reference samples constitutes the reconstructed audio waveform, and the step size is increased or maintained in accordance with the same all-1s-or-0s logic as in the CVSD encoder.

In CVSD, the adaptation of the step size helps to minimize the occurrence of slope overload and granular noise. Slope overload occurs when the slope of the audio signal is so steep that the encoder cannot keep up. Adaptation of the step size in CVSD helps to minimize or prevent this effect by enlarging the step size sufficiently. Granular noise occurs when the audio signal is constant. A CVSD system has no symbols to represent steady state, so a constant input is represented by alternate ones and zeros. Accordingly, the effect of granular noise is minimized when the step size is sufficiently small.

CVSD has been referred to as a compromise between simplicity, low bit rate, and quality. Different forms of CVSD are currently used in a variety of applications. For example, a 12 kbit/s version of CVSD is used in the SECURENET® line of digitally encrypted two-way radio products produced by Motorola, Inc. of Schaumburg, Ill. A 16 kbit/s version of CVSD is used by military digital telephones (referred to as Digital Non-Secure Voice Terminals (DNVT) and Digital Secure Voice Terminals (DSVT)) for use in deployed areas to provide voice recognition quality audio. The Bluetooth® specification for wireless personal area networks (PANs) specifies a 64 kbit/s version of CVSD that may be used to encode voice signals in telephony-related Bluetooth™ service profiles, e.g. between mobile phones and wireless headsets.

Although CVSD is robust to random bit errors as noted above, it is not robust to bursty bit errors. Consequently, when processing an encoded bit stream that includes bursty bit errors, a CVSD decoder may produce a decoded audio output signal that includes an audible click. This artifact may be detected and subsequently concealed using a packet loss concealment algorithm or other concealment technique. However, because CVSD is a type of differential waveform coder, the quality of its performance depends on the maintenance of synchronized state information at the encoder and the decoder. Thus, although artifacts resulting from bursty bit errors may be concealed, the processing of the bursty bit errors by the CVSD decoder will result in a divergence between the state information maintained in memory by the CVSD decoder and the state information maintained in memory by the CVSD encoder. This divergence may result in artifacts that will decay over time, but that may linger for several frames beyond the corrupted frame.

BRIEF SUMMARY OF THE INVENTION

A system and method is provided for compensating for the adverse effects of a diverged state of an audio decoder on a decoded audio signal generated by the audio decoder, wherein the audio decoder is configured to generate the decoded audio signal in accordance with a variable step size. For example, the audio decoder may comprise a Continuously Variable Delta Slope Modulation (CVSD) audio decoder.

In particular, a method for compensating for the effects of a diverged state of an audio decoder on a decoded audio signal generated by the audio decoder is described herein, wherein the audio decoder is configured to generate the decoded audio signal in accordance with a variable step size. In accordance with the method, a first estimated step size associated with a first frame of the decoded audio signal is calculated. A second estimated step size associated with a replacement frame generated to conceal bit errors detected in the first frame of the decoded audio signal is also calculated. A second frame of the decoded audio signal is then modified based on the first estimated step size and the second estimated step size.

A system is also described herein. The system includes an audio decoder, a first step size estimator, a second step size estimator, and a compensator. The audio decoder is configured to generate a decoded audio signal in accordance with a variable step size. The first step size estimator is configured to calculate a first estimated step size associated with a first frame of the decoded audio signal. The second step size estimator is configured to calculate a second estimated step size associated with a replacement frame generated to conceal bit errors in the first frame of the decoded audio signal. The compensator is configured to modify a second frame of the decoded audio signal based on the first estimated step size and the second estimated step size.

A computer program product is also described herein. The computer program product comprises a computer-readable medium having computer program logic recorded thereon for enabling a processing unit to compensate for the effects of a diverged state of an audio decoder on a decoded audio signal generated by the audio decoder, the audio decoder being configured to generate the decoded audio signal in accordance with a variable step size. The computer program logic includes first means, second means and third means. The first means are for enabling the processing unit to calculate a first estimated step size associated with a first frame of the decoded audio signal. The second means are for enabling the processing unit to calculate a second estimated step size associated with a replacement frame generated to conceal bit errors detected in the first frame of the decoded audio signal. The third means are for enabling the processing unit to modify a second frame of the decoded audio signal based on the first estimated step size and the second estimated step size.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

A. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

As discussed in the Background Section above, a Continuous Variable Slope Delta Modulation (CVSD) codec is a memory-based audio codec that is used in a variety of applications. For example, CVSD is the prevailing audio codec used in Bluetooth® wireless communications systems. CVSD is generally selected for its robustness to random bit-errors. However, in a Bluetooth® wireless communications system, interference or low signal-to-noise ratio (SNR) conditions may cause bit-errors to become more concentrated in time, or "bursty." CVSD is not robust to bursty bit-errors, and as a result, annoying "click-like" artifacts may become audible in the decoded audio signal output by the CVSD decoder. It may be possible to detect and conceal artifacts present in a corrupted frame of the decoded audio signal. However, the bursty bit errors will cause the state of the decoder to diverge from that of the encoder. This state mismatch will cause artifacts in the decoded audio signal that may linger for several frames.

A system and method is described herein that may be used to compensate for the effects of a diverged CVSD decoder state on a decoded audio signal. To facilitate a better understanding of the exemplary embodiments of the present invention described herein, Section B below will describe the operation of an example CVSD encoder and decoder. Section C will describe a re-encoding technique that may be used to minimize the effects of CVSD decoder state divergence. Section D will describe a technique for compensating for a diverged CVSD decoder state in accordance with an embodiment of the present invention. Section E will describe a computer system that may be used to implement aspects of the present invention. Section F will provide performance information associated with a particular implementation of the present invention. Section G will provide concluding remarks.

B. Example CVSD Encoder and Decoder Implementations

Figure 1:
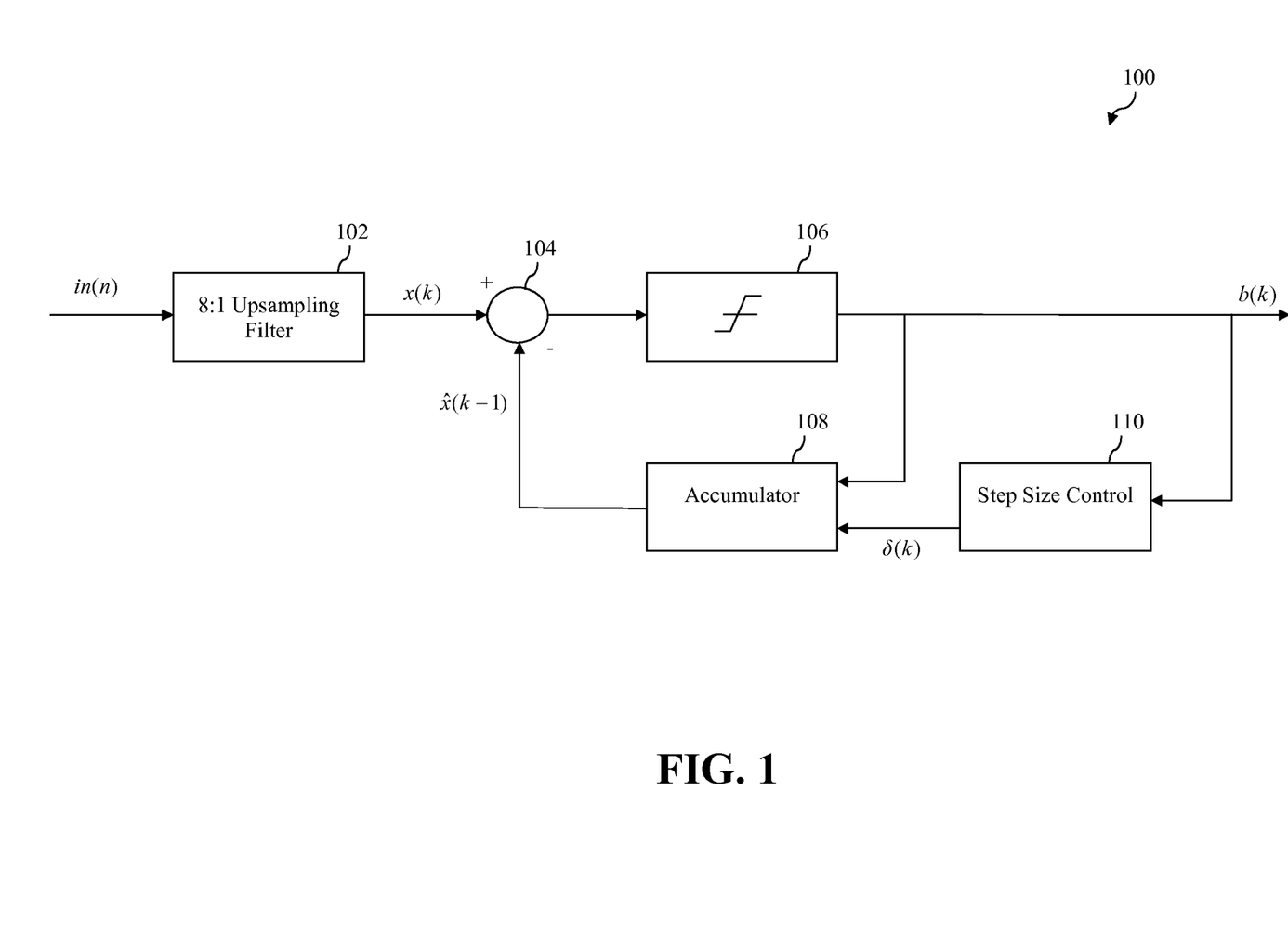
FIG. 1 is a block diagram of an example Continuously Variable Slope Delta Modulation (CVSD) encoder.

Example implementations of a CVSD encoder and a CVSD decoder will now be described. In particular, FIG. 1 is a functional block diagram of an example CVSD encoder 100 that may be used in a Bluetooth® wireless communications system or other audio communications system. As shown in FIG. 1, the input to CVSD encoder 100 is an 8 kHz audio signal denoted audio sample in(n), which is the n-th sample in a series of audio samples that comprise an 8 kHz audio signal denoted in. An 8:1 up-sampling filter 102 operates to up-sample the sample in(n) to produce eight samples of a 64 kHz linear pulse code modulation (PCM) signal, denoted x. The output of 8:1 up-sampling filter 102 is an input audio sample x(k), which is the k-th sample in the 64 kHz linear PCM signal.

As further shown in FIG. 1, a subtractor 104 is configured to subtract a reconstructed version of the previous input audio sample, denoted $\hat{x}(k-1)$, from the input audio sample x(k). A logic block 106 is configured to apply a sign function to the difference to derive an encoded output bit b(k). The sign function is defined such that:

$$\text{sgn}(x) = \begin{cases} 1, & \text{for } x \geq 0, \\ -1, & \text{otherwise.} \end{cases} \quad (1)$$

Thus, if input audio sample x(k) is larger than reconstructed sample $\hat{x}(k-1)$, then the value of b(k) will be 1; otherwise the value of b(k) will be −1. In one implementation, when b(k) is transmitted on the air, it is represented by a sign bit such that negative numbers are mapped on "1" and positive numbers are mapped on "0". The encoded output bits are output at a rate of 64 kb/s.

Step size control block 110 is configured to determine a step size associated with the current input audio sample, denoted $\delta(k)$. To determine $\delta(k)$, step size control block 110 is configured to first determine the value of a syllabic companding parameter, denoted $\alpha$. The syllabic companding parameter $\alpha$ is determined as follows:

$$\alpha = \begin{cases} 1, & \text{if } J \text{ bits in the last } K \text{ output bits are equal,} \\ 0, & \text{otherwise.} \end{cases} \quad (2)$$

In accordance with Version 2.0 of the Bluetooth® specification, the parameter J=4 and the parameter K=4 for 64 bit/s CVSD. Based on the value of the syllabic companding parameter $\alpha$, step size control block 110 is configured to determine the step size $\delta(k)$ in accordance with:

$$\delta(k) = \begin{cases} \min(\delta(k-1) + \delta_{min}, \delta_{max}), & \alpha = 1, \\ \max(\beta \cdot \delta(k-1), \delta_{min}), & \alpha = 0, \end{cases} \quad (3)$$

wherein $\delta(k-1)$ is the step size associated with the previous input audio sample, $\delta_{min}$ is the minimum step size, $\delta_{max}$ is the maximum step size, and $\beta$ is the decay factor for the step size.

In accordance with Version 2.0 of the Bluetooth® Specification, $\delta_{min}$=10, $\delta_{max}$=1280 and $$\beta = 1 - \frac{1}{1024}$$

for 64 kbit/s CVSD.

Figure 3:
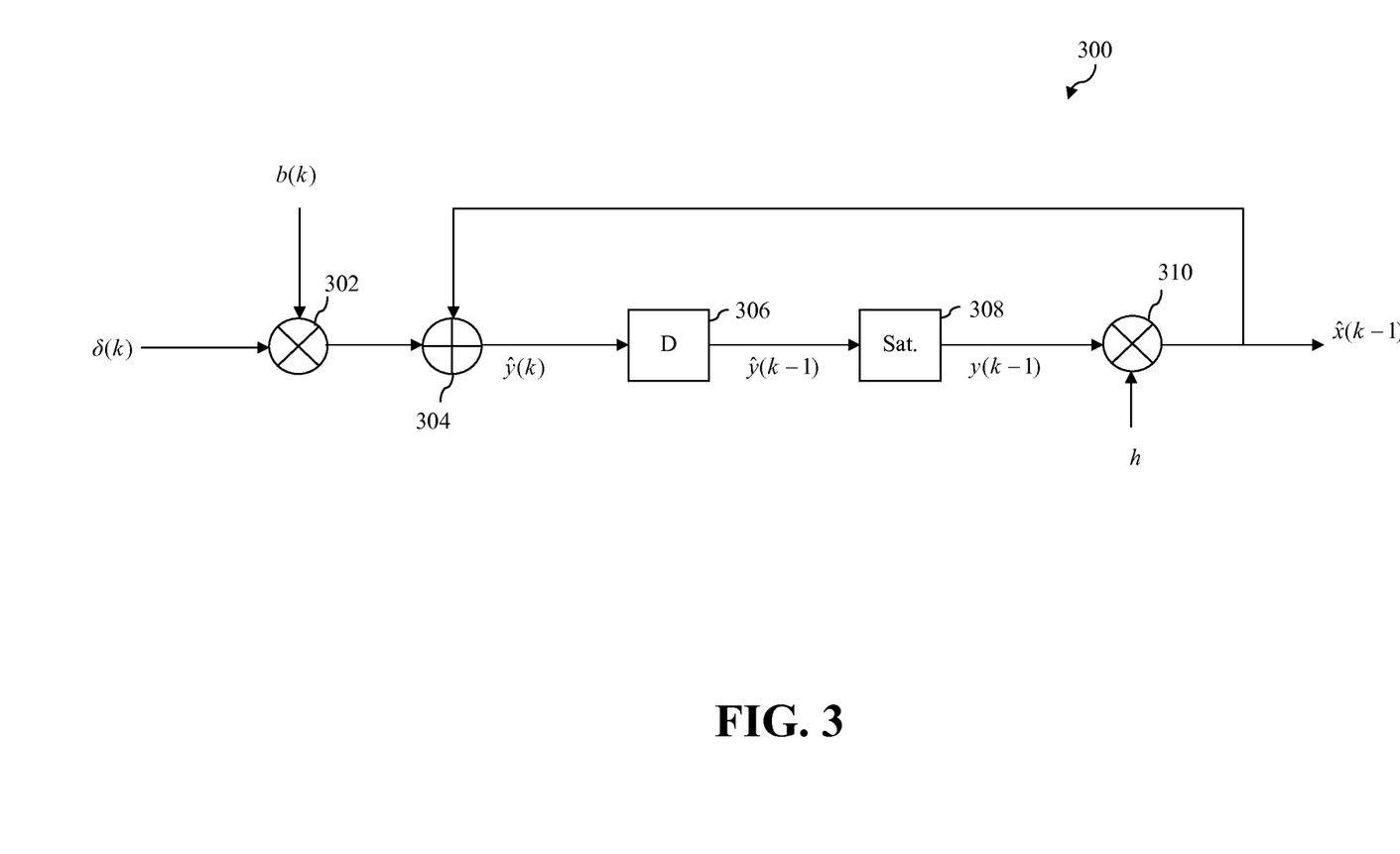
FIG. 3 is a block diagram of an accumulator that may be used to implement the CVSD encoder of FIG. 1 or the CVSD decoder of FIG. 2.

As also shown in FIG. 1, an accumulator 108 is configured to receive output bit b(k) and step size $\delta(k)$ and to generate the reconstructed version of the previous input speech sample $\hat{x}(k-1)$ therefrom. FIG. 3 is a block diagram 300 that shows how accumulator 108 operates to perform this function. In particular, as shown in FIG. 3, a first multiplier 302 and an adder 304 are configured to calculate a value $\hat{y}(k)$ in accordance with:

$$\hat{y}(k) = \hat{x}(k-1) + b(k)\delta(k). \quad (4)$$

A delay block 306 is configured to introduce one clock cycle of delay such that $\hat{y}(k)$ may now be represented as $\hat{y}(k-1)$. A logic block 308 is configured to apply a saturation function to $\hat{y}(k-1)$ to generate accumulator contents y(k−1). The saturation function is defined as:

$$y(k) = \begin{cases} \min(\hat{y}(k), y_{max}), & \hat{y}(k) \geq 0 \\ \max(\hat{y}(k), y_{min}), & \hat{y}(k) < 0, \end{cases} \quad (5)$$

wherein $y_{min}$ and $y_{max}$ are the accumulator's negative and positive saturation values, respectively. In accordance with Version 2.0 of the Bluetooth® Specification, the parameter $y_{min}$ is set to $-2^{15}$ or $-2^{15}+1$ and the parameter $y_{max}$ is set to $2^{15}-1$ for 64 kbit/s CVSD. Finally, a second multiplier 310 is configured to multiply y(k−1) by the delay factor for the accumulator, denoted h, to produce the reconstructed version of the previous input speech sample $\hat{x}(k-1)$. In accordance with Version 2.0 of the Bluetooth® specification, $$h = 1 - \frac{1}{32}$$

for 64 kbit/s CVSD.

Figure 2:
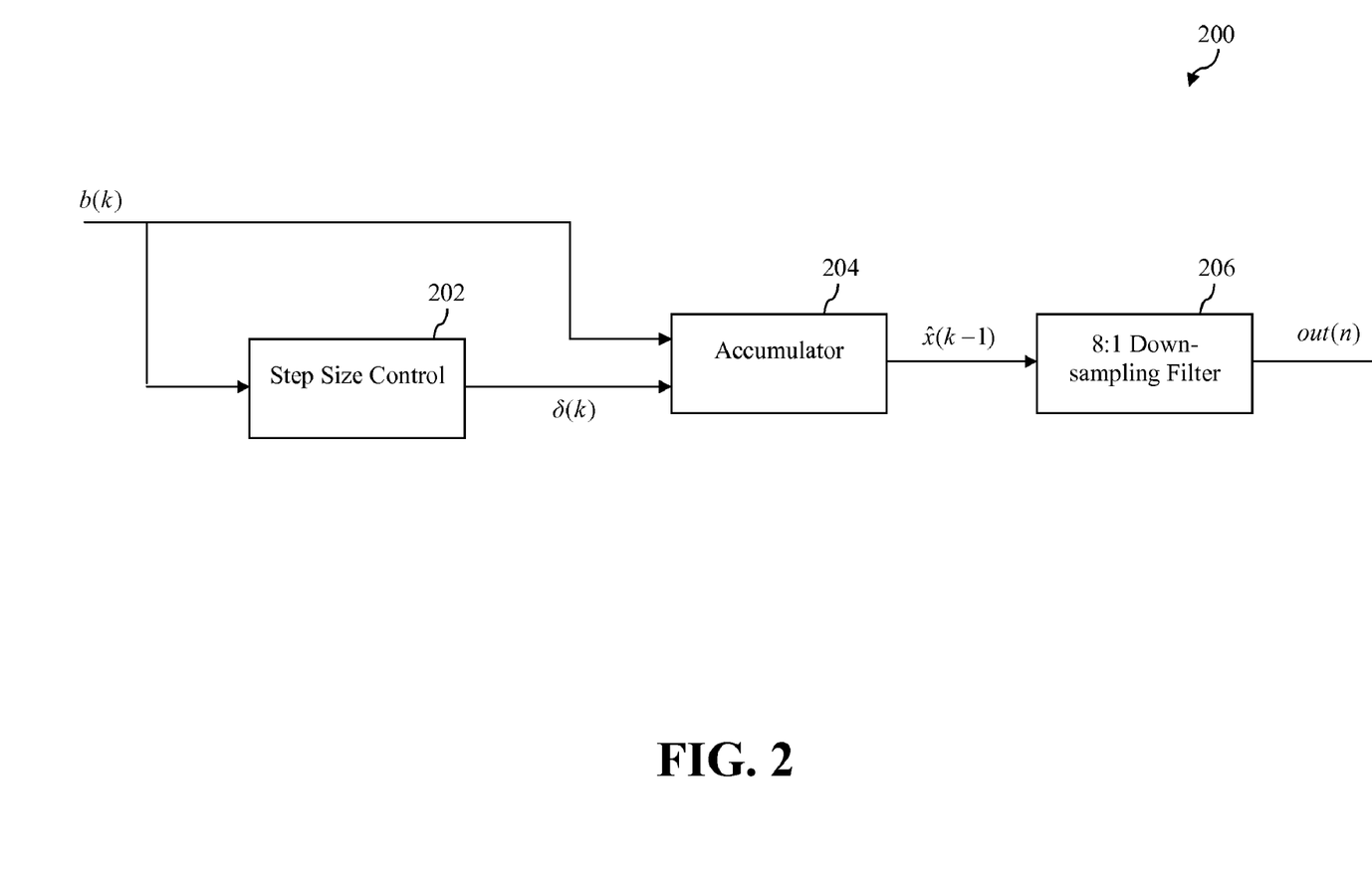
FIG. 2 is a block diagram of an example CVSD decoder.

FIG. 2 is a functional block diagram of an example CVSD decoder 200 that may be used in a Bluetooth® wireless communications system or other audio communications system. As shown in FIG. 2, CVSD decoder 200 receives an encoded input bit b(k) and produces therefrom a reconstructed version of the previous audio sample $\hat{x}(k-1)$. CVSD decoder 200 essentially reverses the encoding process applied by CVSD encoder 100 by adding or subtracting the step size $\delta(k)$ to a previously reconstructed audio sample according to the value of input bit b(k). As shown in FIG. 2, CVSD decoder 200 includes a step size control block 202 that is configured to operate in a like manner to step size control block 110 of CVSD encoder 100 and an accumulator 204 that is configured to operate in a like manner to accumulator 108 of CVSD encoder 100.

CVSD decoder 200 further includes an 8:1 downsampling filter 206 that receives reconstructed audio samples output from accumulator 204, which taken together comprise a reconstructed 64 kHz linear PCM signal. Downsampling filter 206 is configured to downsample the signal to produce an 8 kHz audio output signal. In particular, downsampling filter 206 processes 8 reconstructed audio samples from accumulator 204 to produce a single output audio sample out(n), which is the n-th sample in the series of audio samples that comprises the 8 kHz audio signal denoted out.

As can be seen from the foregoing, the proper performance of example CVSD encoder 100 and example CVSD decoder 200 is dependent upon the synchronized maintenance by both entities of certain state information. This state information includes, for example, the reconstructed version of the previous audio sample $\hat{x}(k-1)$, the four previous output bits $b(k-1)$, $b(k-2)$, $b(k-3)$ and $b(k-4)$ needed to determine the current value of the syllabic companding parameter $\alpha$, and the step size corresponding to the previous audio sample $\delta(k-1)$. However, as described in the preceding section, when bursty bit errors are introduced into the encoded bit stream transmitted from CVSD encoder 100 to CVSD decoder 200, this can cause the state information maintained by both entities to diverge, resulting in the production of a corrupted audio output signal by CVSD decoder 200.

C. Re-Encoding Based Approach to Addressing Decoder State Divergence

Figure 4:
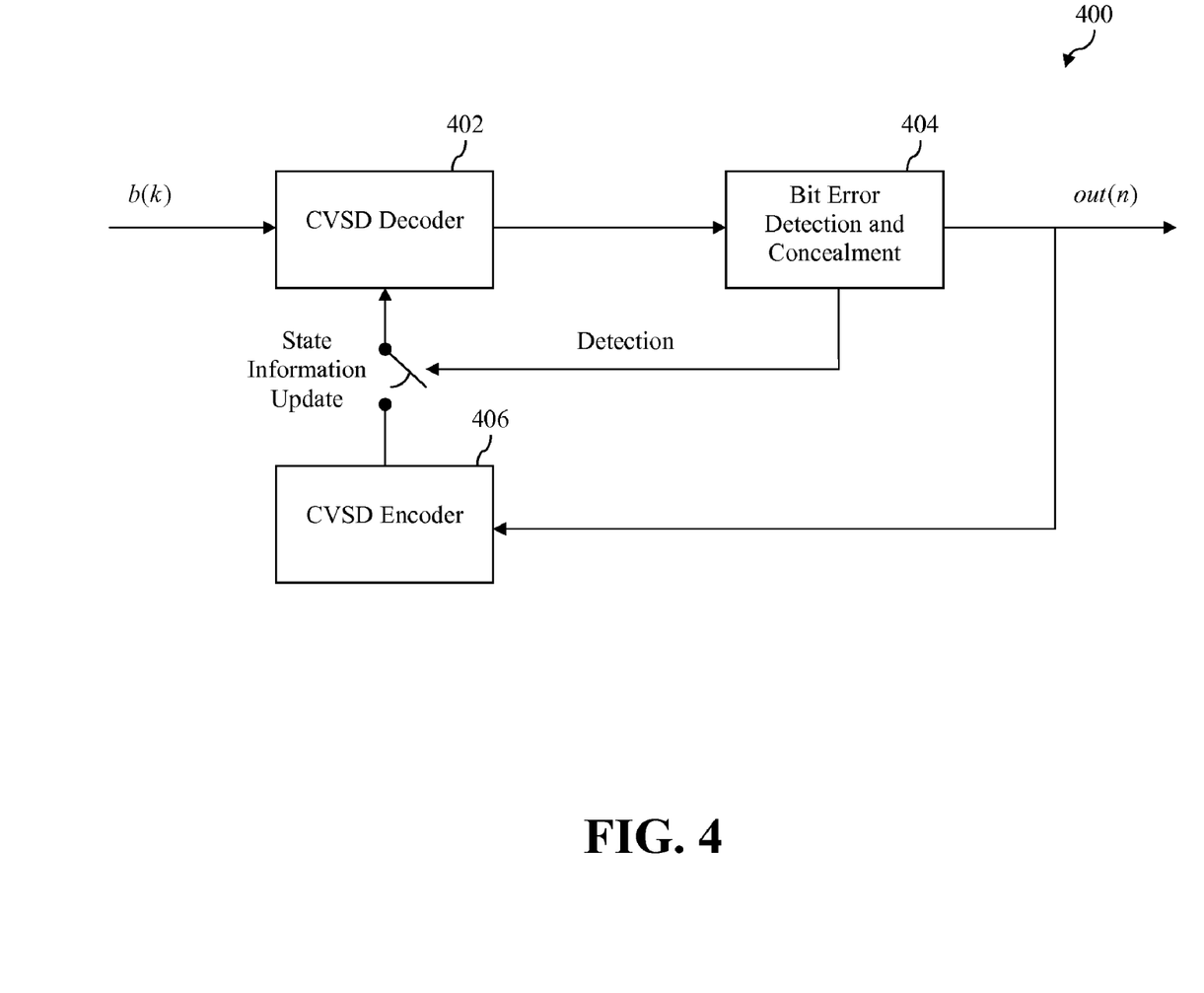
FIG. 4 is a block diagram of a system that performs re-encoding to minimize the effects of CVSD decoder state divergence.

One possible approach to minimize the adverse effects of decoder state divergence is to use a technique called re-encoding. FIG. 4 is a block diagram of an example system 400 that utilizes such an approach. As shown in FIG. 4, system 400 includes a CVSD decoder 402, a bit error detection and concealment block 404 and a CVSD encoder 406.

CVSD decoder 402 operates in a like manner to CVSD decoder 200 described above in reference to FIG. 2 to receive an encoded bit stream b(k) and to produce a decoded audio signal therefrom. The decoded audio signal produced by CVSD decoder 200 is provided to bit error detection and concealment block 404. Bit error detection and concealment block 404 is configured to analyze the decoded audio signal to determine if there are bit errors in the encoded bit stream sufficient to create an audible artifact in the decoded audio signal. If no such bit errors are detected, then bit error detection and concealment block 404 provides the decoded audio signal as audio output signal out(n). However, if such bit errors are detected, then bit error detection and concealment block 404 replaces a corrupted portion of the decoded audio signal with a concealment waveform and the concealment waveform is provided as audio output signal out(n).

If bit error detection and concealment block 404 detects bit errors in the encoded bit stream sufficient to create an audible artifact in the decoded audio signal, bit error detection and concealment block 404 also asserts a detection signal that causes CVSD encoder 406 to update state information maintained by CVSD decoder 402. To perform this update, CVSD encoder 406 encodes the concealment waveform provided as out(n), thereby updating certain state information maintained by CVSD encoder 406, and then overwrites the state information maintained by CVSD decoder 402 with the updated CVSD encoder state information. As described in the previous section, such state information includes, for example, the reconstructed version of the previous audio sample $\hat{x}(k-1)$, the four previous output bits $b(k-1)$, $b(k-2)$, $b(k-3)$ and $b(k-4)$ needed to determine the current value of the syllabic companding parameter $\alpha$, and the step size corresponding to the previous audio sample $\delta(k-1)$. Since the concealment waveform should closely resemble the true decoded audio signal, the state information generated by CVSD encoder 406 should closely match that of the CVSD encoder on the transmit side of the wireless communications channel. Note that this method of re-encoding must account for the delay introduced by the upsampling/downsampling operations in order to align the memory correctly.

It has been observed that re-encoding is effective at correcting the state of a diverged decoder. However, there are several potential issues with re-encoding: (1) the complexity of the encoder is greater than or equal to the complexity of the decoder, so adding an encoder block at the decoder effectively doubles the peak complexity; (2) the CVSD decoder may be implemented in hardware so that the state information maintained by the CVSD decoder may not be easily accessible; and (3) the CVSD encoder used for re-encoding may be implemented in hardware and may not always be available in multi-channel applications.

D. Compensation Technique for Addressing Decoder State Divergence

Figure 5:
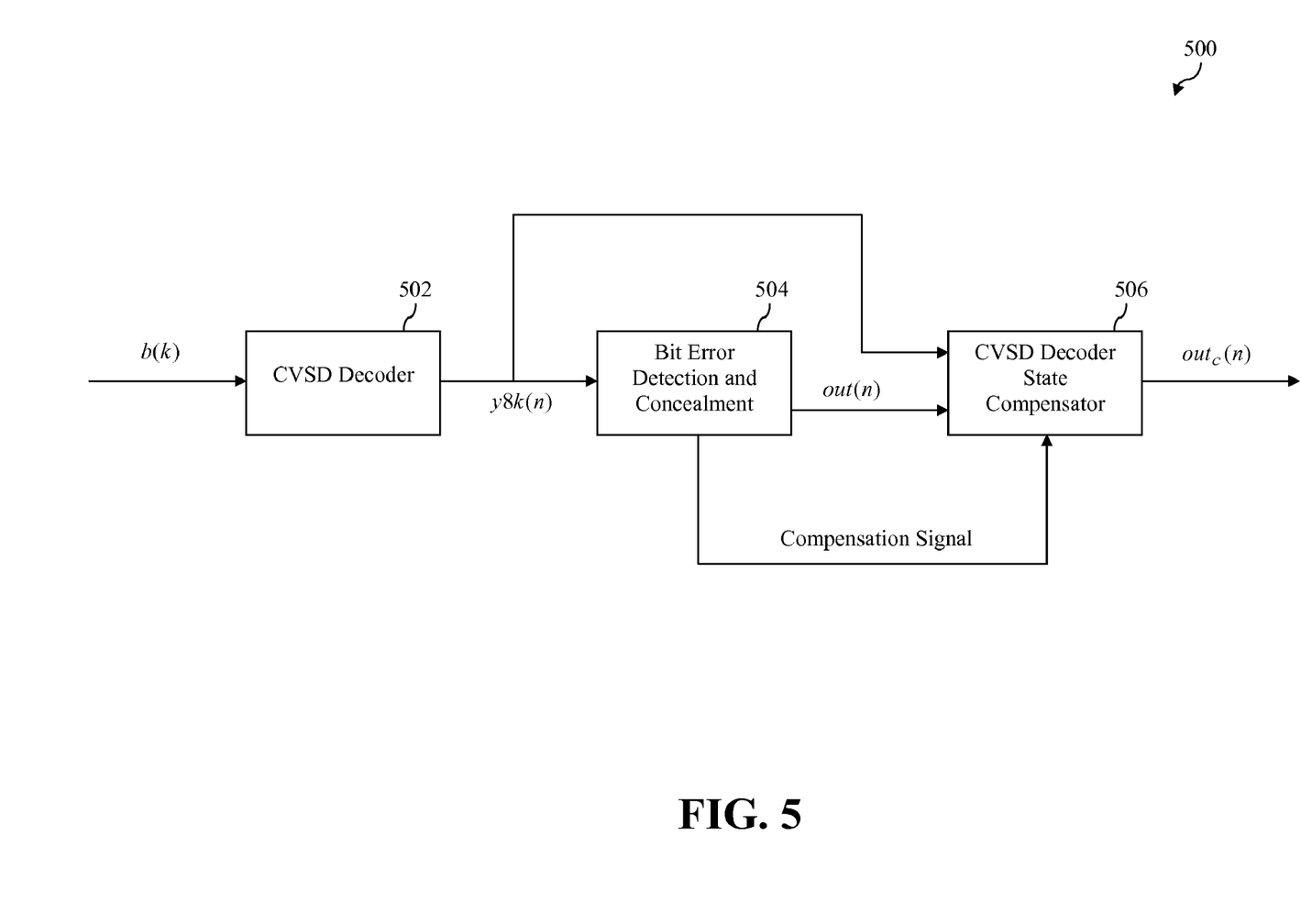
FIG. 5 is a block diagram of a system that modifies a decoded audio signal to compensate for the effects of a diverged CVSD decoder state in accordance with an embodiment of the present invention.

An embodiment of the present invention provides a solution for minimizing the adverse effects of a diverged CVSD decoder state in a manner that avoids issues associated with re-encoding, such as those described in the preceding section. FIG. 5 is a block diagram of an example system 500 that implements such a solution. System 500 operates to modify the decoded audio signal to compensate for the diverged CVSD decoder state rather than estimating and correcting the CVSD decoder state as in the case of re-encoding. Thus system 500 need not implement a CVSD encoder and also does not require access to the CVSD decoder state information.

System 500 may be implemented, for example, as part of any audio device that is capable of receiving a CVSD encoded bit stream and decoding the bit stream to produce a decoded audio signal. For example, system 500 may be implemented in a Bluetooth® device that receives a CVSD encoded bit stream over a wireless channel and decodes the bit stream to produce a decoded audio signal for playback to a user. In such an implementation, the audio output signal produced by system 500 would be converted from a digital to analog form by a digital-to-analog converter and then played back by a loudspeaker. However, this is only one example, and system 500 may be implemented in other types of audio devices.

As shown in FIG. 5, system 500 includes a CVSD decoder 502, a bit error detection and concealment block 504, and a CVSD decoder state compensator 506. CVSD decoder 502 operates in a like manner to CVSD decoder 200 described above in reference to FIG. 2 to receive an encoded bit stream b(k) and to produce an 8 kHz decoded audio signal, denoted y8k(n), therefrom. The decoded audio signal y8k(n) is provided to bit error detection and concealment block 504.

Bit error detection and concealment block 504 is configured to analyze the decoded audio signal to determine if there are bit errors in the encoded bit stream sufficient to create an audible artifact in the decoded audio signal. If no such bit errors are detected, then bit error detection and concealment block 504 provides the decoded audio signal as audio output signal out(n). However, if such bit errors are detected, then bit error detection and concealment block 504 replaces a corrupted portion of the decoded audio signal with a concealment waveform and the concealment waveform is provided as audio output signal out(n).

If bit error detection and concealment block 504 detects bit errors in the encoded bit stream sufficient to create an audible artifact in the decoded audio signal, bit error detection and concealment block 504 also asserts a compensation signal that causes CVSD decoder state compensator 506 to modify the audio output signal out(n) in a manner to be described herein to compensate for adverse effects of a diverged state of CVSD decoder 502. The modified audio output signal is then provided as the compensator audio output signal $out_c(n)$. If, however, bit error detection and concealment block 504 does not detect such bit errors, then bit error detection and concealment block 504 will not assert the compensation signal and CVSD decoder state compensator 506 will provide the audio output signal out(n) as the compensator audio output signal $out_c(n)$.

By far, the most perceptually important state information component maintained by a CVSD decoder is the step size $\delta(k)$. It has been found that if $\delta(k)$ is accurately reset to its true value after bursty bit errors, any distortion due to the diverged state of the CVSD decoder is largely eliminated. Since $\delta(k)$ is related to the level of the decoded audio signal y8k(n), one approach to compensating for a corrupted $\delta(k)$ would be to compute the energy level in y8k(n) and in audio output signal out(n) whenever compensation is desired. If Ey8 denotes the energy level in y8k(n) and Eout denotes the energy level in out(n) for a corrupted frame, then the ratio Ey8/Eout represents an estimate of energy ratio that the decoded audio signal will be in error in the next frame. Hence, the first sample of the compensator audio output signal $out_c(n)$ corresponding to the next frame could be rescaled according to:

$$out_c(0)=out(0)\cdot\sqrt{Eout/Ey8}. \quad (6)$$

Assuming that CVSD decoder 502 is implemented in accordance with Version 2.0 of the Bluetooth® specification, $\delta(k)$ will have a decay rate of 1023/1024 at 64 kHz. Consequently, the error in $\delta(k)$ will also decay approximately at this rate. As such, the compensation scale factor must also decay at approximately this rate. Hence, a solution for attenuating subsequent samples in the same frame might be:

$$out_c(n)=out(n)\cdot(1-\sqrt{Eout/Ey8})^{\beta''})\beta\approx(1023/1024)^8, \quad n\geq 0, Ey8\geq Eout. \quad (7)$$

However, there are some drawbacks to using this approach. First, the amplitude of the decoded audio signal y8k(n) at any given time and the step size $\delta(k)$ generally follow each other but are not necessarily linearly related. Second, bit error detection and concealment block 504 may not be able to accurately determine the location of detected bit errors within a corrupted frame. For example, the errors could occur at the beginning of the frame and the remaining portion of the frame may be received correctly, meaning that the step size error will have already begun to decay before the beginning of the next frame. Thus, it would be better to use only the last samples of the corrupted frame to compute Eout and Ey8. However, simply using the last sample in the frame is also not accurate because the out(n) signal is a concealment waveform and only an estimate of the true decoded audio signal, and may be out of phase with the original.

What is really needed then is the actual value of the step size $\delta(k)$ after generation of y8k(FRSZ-1) and out(FRSZ-1), where FRSZ is the frame size and q(FRSZ-1) represents the last sample in the frame for signal q. However, as previously described, $\delta(k)$ is a parameter that is computed internally by CVSD decoder 502 via processing of the up-sampled 64 kHz signal. A brute force method for obtaining the step size $\delta(k)$ after generation of y8k(FRSZ-1) and out(FRSZ-1) would be to re-encode y8k(n) and out(n) by means of up-sampling and CVSD encoding. However, that would be very costly in terms of either extra hardware or processor cycle consumption in firmware/software. To address this issue, an embodiment of the present invention implements a novel low-complexity algorithm to estimate the step size $\delta(k)$ directly from the 8 kHz signals themselves.

Figure 6:
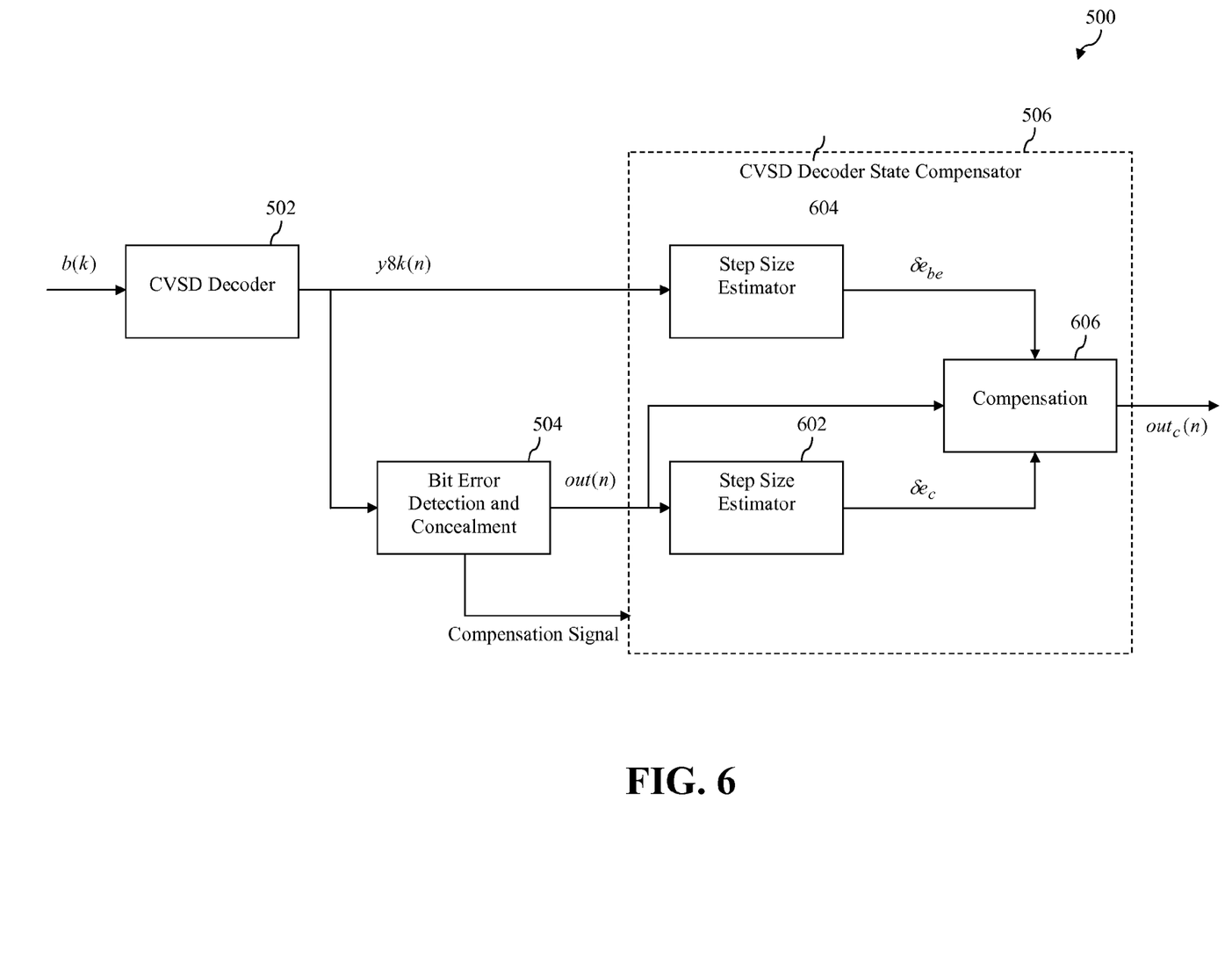
FIG. 6 is a block diagram of one implementation of the system of FIG. 5 that shows a CVSD decoder state compensator in more detail.

This embodiment will now be described in reference to FIG. 6. In particular, FIG. 6 is a block diagram of one implementation of system 500 of FIG. 5 that shows CVSD decoder state compensator 506 in more detail. As shown in FIG. 6, CVSD decoder state compensator 506 includes a first step size estimator 602, a second step size estimator 604 and a compensation block 606. Each of these components will now be described.

As will be discussed below, first step size estimator 602 and second step size estimator 604 may each be implemented by providing different inputs to the same step size estimation logic. This step size estimation logic is used to estimate a step size $\delta(k)$ at a rate of 8 kHz directly from the 8 kHz audio output signal out(n) and directly from the 8 kHz decoded audio signal y8k(n). The manner in which the step size estimation logic is implemented will now be described.

Let index n denote the sample time in the 8 kHz domain, and index k denote the sample time in 64 kHz domain. What is sought to be estimated is:

$$\delta e(n)\cong\delta(8\cdot n+\omega) \quad (8)$$

where $\delta e(n)$ is the estimated step size, $\delta(k)$ is the actual step size embedded within CVSD decoder 502, and $\omega$ represents the phase relationship between the 64 kHz audio signal generated by CVSD decoder 502 prior to down-sampling and the down-sampled 8 kHz version, y8k(n), and is a constant between 0 and 7. Since $\omega$ is a constant and is dependent on the down-sampling filters only, it may be ignored from now on.

To understand how to obtain $\delta e(n)$, one must understand how $\delta(k)$ operates in the 64 kHz domain. Such an understanding may be obtained from Section B above, which describes CVSD encoder and decoder implementations in accordance with Version 2.0 of the Bluetooth® specification. In reviewing that section, the first thing to notice in regard to the step size $\delta(k)$ is that the most it can increase from one 64 kHz sample to the next is $\delta_{min}$, implying that the most the step size can increase from one 8 kHz sample to the next is $8\cdot\delta_{min}=80$. This will only occur if the syllabic companding parameter $\alpha=1$ for 8 consecutive 64 kHz samples. This can be iteratively derived to imply that:

IFF $x(k)>6.1776\cdot\delta(k-8)+0.7757\cdot x(k-8)+254.9428$

THEN $\delta(k)=\delta(k-8)+80 \quad (9)$ where IFF means "if and only if." If one assumes that y8k(n) $\cong$x(8·k) (this implies that the CVSD encoder has done a good job encoding the input) and $\delta e(n)\cong\delta(8\cdot k)$, then by observing only y8k(n), one can determine the maximum bound of the step size from one 8 kHz sample to the next. Equation 9 then becomes:

IFF $y8k(n)>6.1776\cdot\delta e(n-1)+0.7757\cdot y8k(n-1)+254.9428$

THEN $\delta e(n)=\delta e(n-1)+80 \quad (10)$

On the other hand, if $\alpha=0$ for 8 consecutive 64 kHz samples, then the step size $\delta(k)$ will decay by:

$$\delta(k)=\delta(k-8)\cdot\beta^8=\delta(k-8)\cdot 0.9922 \quad (11)$$

The above observations provide a foundation for the step size estimation logic. The sample-by-sample step size estimation process is shown below:

$$f1 = \frac{-0.23}{200}\cdot\delta e(n-1) + \frac{223}{200} \quad (12)$$

$$f1 = \min(\max(f1, 0.77), 1.0) \quad (13)$$

$$d1 = in8k(n) - \hat{y}e(n-1)\cdot 0.77 \quad (14)$$

$$d = |d1| - \delta e(n-1)\cdot 6.17\cdot f1 \quad (15)$$

-continued $$\text{IF } (d > 0) \quad (16)$$

$$g = \frac{|d1| - \delta e(n-1) \cdot 6.17 \cdot f1}{6.17 \cdot f1} \quad (17)$$

$$g = \min(\max(g, 0), 80) \quad (18)$$

$$\delta e(n) = \delta e(n-1) + g \quad (19)$$

$$\delta e(n) = \min(\max(\delta e(n), \delta_{min}), \delta_{max}) \quad (20)$$

$$\text{ELSE} \quad (21)$$

$$\delta e(n) = \delta e(n-1) \cdot \beta^8 \quad (22)$$

$$\delta e(n) = \max(\delta e(n), \delta_{min}) \quad (23)$$

$$\text{END} \quad (24)$$

$$\text{IF}(d1 > 0) \quad (25)$$

$$\hat{y}e(n) = ye(n-1) \cdot 0.77 + \delta e(n) \cdot 6.17 \cdot f1 \quad (26)$$

$$\text{ELSE} \quad (27)$$

$$\hat{y}e(n) = ye(n-1) \cdot 0.77 - \delta e(n) \cdot 6.17 \cdot f1 \quad (28)$$

$$\text{END} \quad (29)$$

$$a = \frac{600 - \delta e(n)}{435} \quad (30)$$

$$a = \min(\max(a, 0), 1) \quad (31)$$

$$\hat{y}e(n) = \hat{y}e(n) \cdot a + in8k(n) \cdot (1-a) \quad (32)$$

The generalized input signal is in8K(n). As will be described below, for first step size estimator 602, the input signal is out(n) and for second step size estimator 604, the input signal is y8k(n). The estimated step size is given by $\delta e(n)$. Some points about a few of the foregoing equations will now be made.

It has been observed that, as the step size increases, it is better to use the original sample in8k(n) for $\hat{y}e(n)$ rather than performing the calculations set forth in Equations 25-28. As a result, a weighted mix is used as shown in Equations 30-32.

It is difficult to account for the "in between" situations where there will be some update and some decay in the 64 kHz domain update of the step size. Also, the dynamics of this seem to change with the step size. If the step size is small, the update is coarse, whereas when the step size is larger, there is a finer update. To account for this, the factor f1 has been introduced.

As noted above, when bit error detection and concealment block 504 has detected bit errors in the encoded bit stream sufficient to create an audible artifact in the decoded audio signal y8k(n), bit error detection and concealment block 404 asserts a compensation signal that causes CVSD decoder state compensator 506 to modify the audio output signal out(n). To perform the modification, two step size estimates are required: (1) an estimate of the step size after production of the last sample in the corrupted frame of the decoded audio signal y8k(n) by CVSD decoder 502, and (2) an estimate of the step size after production of the last sample of the concealment signal out(n) corresponding to the corrupted frame by a hypothetical CVSD decoder.

In an embodiment, first step size estimator 602 is configured to maintain a step size estimate $\delta e_c$ for audio output signal out(n) in memory by invoking the step size estimation logic described above on a frame-by-frame basis. Let $\hat{y}e(-1)$ and $\delta e(-1)$ be the estimate signals for sample FRSZ−1 of frame f−1, wherein FRSZ is the number of samples in a frame. Then step size estimator 602 invokes the step size estimation logic for samples n=0 . . . FRSZ−1 of frame f to obtain $\hat{y}e$(FRSZ−1) and $\delta e$(FRSZ−1).

Upon assertion of the compensation signal by bit error detection and concealment block 504, first step size estimator 602 stores the estimate $\delta e$(FRSZ−1) as:

$$\delta e_c = \delta e(FRSZ-1) \quad (33)$$

wherein $\delta e_c$ is the estimated step size after generation of the last sample of the concealment signal out(n) corresponding to the corrupted frame. Second step size estimator 604 then invokes the step size estimation logic for FRSZ samples with y8k(n) as input and $\delta e(-1)$ and $\hat{y}e(-1)$ are used as memory to obtain:

$$\delta e_{be} = \delta e(FRSZ-1) \quad (34)$$

wherein $\delta e_{be}$ is the estimated step size after generation of the last sample in the corrupted frame of the decoded audio signal y8k(n).

Compensation block 606 is configured to execute on every sample of the audio output signal out(n) according to the equation:

$$out_c(n) = out(n) \cdot \lambda(n) \quad (35)$$

wherein $$\lambda(n+1) = (1 - SSATT) + \lambda(n) \cdot SSATT \quad (36)$$

and wherein SSATT≅$\beta^8$. The step size attenuation factor SSATT represents the amount that the step size error decays over time and this is approximately equal to the decay rate of the step size itself. This value is tuned through listening and in one embodiment is set to 0.9952.

The compensation factor $\lambda(n)$ is reset at the first sample (n=0) of the first good frame following a detected corrupted frame according to:

$$\lambda(0) = \frac{\delta e_c}{\delta e_{be}} \quad (37)$$

If the frame of out(n) being processed by compensation block 606 is not the first good frame after a corrupted frame, then $\lambda(0)$ is set to $\lambda$(FRSZ) from the previous frame.

Figure 7:
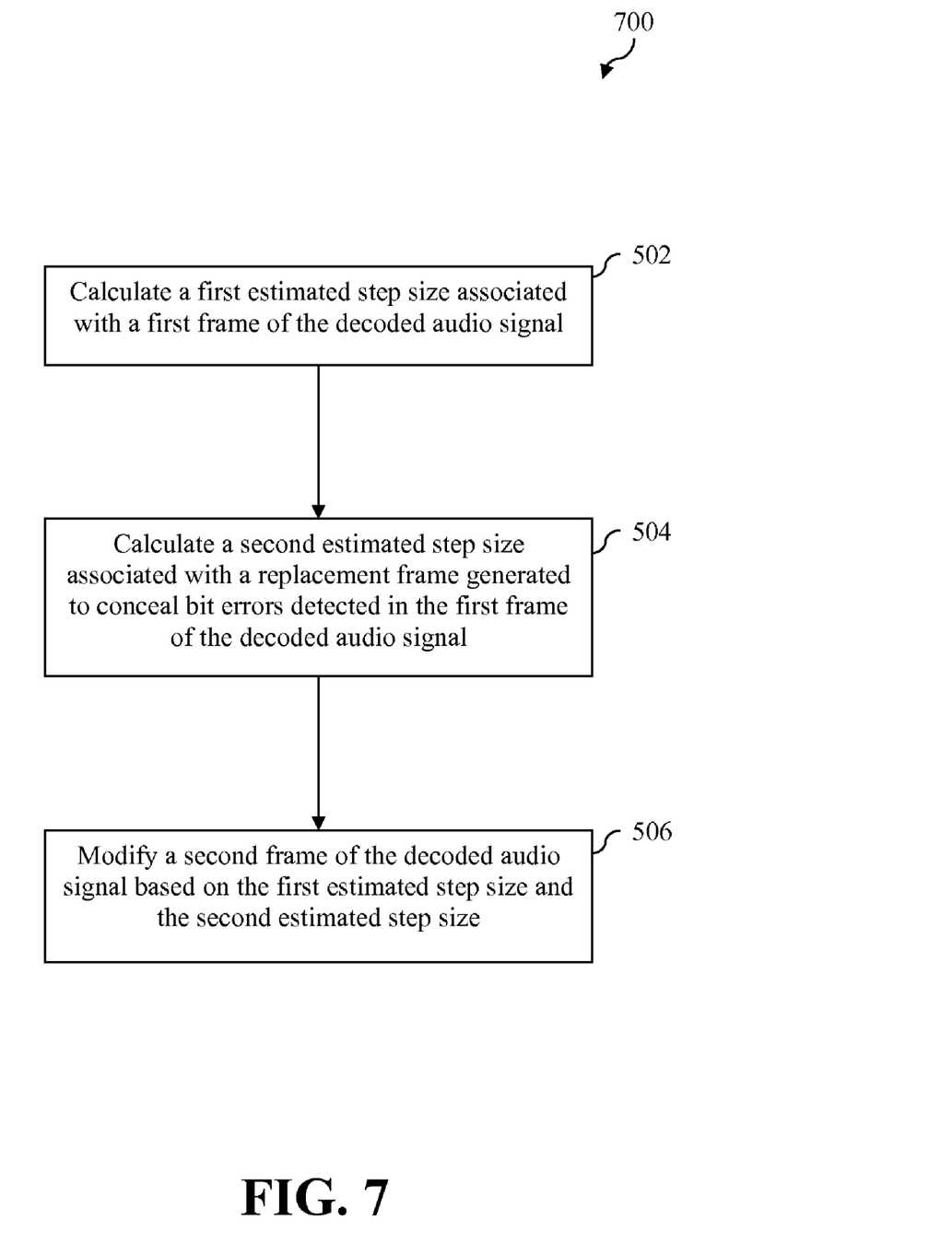
FIG. 7 depicts a flowchart of a method for compensating for the effects of a diverged state of an audio decoder on a decoded audio signal generated by the audio decoder in accordance with an embodiment of the present invention.

FIG. 7 depicts a flowchart 700 of an example method for compensating for the effects of a diverged state of an audio decoder on a decoded audio signal generated by the audio decoder in accordance with an embodiment of the present invention. The audio decoder comprises a decoder that generates the decoded audio signal in accordance with a variable step size, such as a CVSD audio decoder.

As shown in FIG. 7, the method begins at step 702 in which a first estimated step size associated with a first frame of the audio signal is calculated. Calculating the first estimated step size may include calculating an estimate of a step size maintained by the audio decoder following generation of a last sample in the first frame of the decoded audio signal. In a particular embodiment described above, the decoded audio signal is the 8 kHz decoded audio signal represented as y8k(n), the first frame is a frame in which bursty bit errors have been detected by bit error detection and concealment block 504, and the first estimated step size is denoted $\delta e_{be}$.

At step 704, a second estimated step size associated with a replacement frame generated to conceal bit errors detected in the first frame of the decoded audio signal is calculated.

Calculating the second estimated step size may include calculating an estimate of a step size maintained by a hypothetical audio decoder following generation of a last sample in the replacement frame. In a particular embodiment described above, the replacement frame is the concealment waveform output as part of the 8 kHz audio output signal represented as out(n) and the second estimated step size is denoted $\delta e_c$.

At step 706, a second frame of the decoded audio signal is modified based on the first estimated step size and the second estimated step size. In one embodiment, the second frame comprises the first good frame following the corrupted first frame and this step comprises calculating a series of output samples in accordance with:

$$out_c(n) = out(n) \cdot \lambda(n), \text{ for } n=0 \ldots FRSZ-1$$

wherein $out_c(n)$ represents a modified sample of the second frame of the decoded audio signal, out(n) represents an unmodified sample of the second frame of the decoded audio signal, $\lambda(n)$ is a compensation factor associated with sample n of the second frame of the decoded audio signal and FRSZ represents a number of samples in the second frame of the decoded audio signal. The compensation factor to be applied to the first sample of the second frame may be determined in accordance with:

$$\lambda(0) = \frac{\delta e_c}{\delta e_{be}},$$

wherein, $\delta e_{be}$ represents the first estimated step size and $\delta e_c$ represents the second estimated step size. The compensation factor to be applied to subsequent samples of the second frame may be determined in accordance with:

$$\lambda(n+1) = (1-SSATT) + \lambda(n) \cdot SSATT,$$

wherein $SSATT \cong \beta^8$, and $$\beta = \frac{1023}{1024}.$$

In accordance with one implementation, the foregoing method of flowchart 700 further includes modifying one or more subsequent frames of the decoded audio signal by calculating, for each series of samples corresponding to a subsequent frame of the decoded audio signal, a series of output samples in accordance with:

$$out_c(n) = out(n) \cdot \lambda(n), \text{ for } n=0 \ldots FRSZ-1$$

wherein $out_c(n)$ represents a modified sample of the subsequent frame of the decoded audio signal, out(n) represents an unmodified sample of the subsequent frame of the decoded audio signal, FRSZ represents a number of samples in the subsequent frame of the decoded audio signal, $\lambda(0)$ is a compensation factor associated with a last sample of a previous frame of the decoded audio signal, and $\lambda(n+1)=(1-SSATT)+\lambda(n) \cdot SSATT$, wherein $SSATT \cong \beta^8$, and $$\beta = \frac{1023}{1024}.$$

In accordance with a further implementation, the foregoing method of flowchart 700 includes detecting the bit errors in the first frame of the decoded audio signal and generating the replacement frame to conceal the bit errors. This function may be performed for example by bit error detection and concealment block 504 of system 500. The method may also include performing at least step 706 responsive to the detection of the bit errors in the first frame of the decoded audio signal.

E. Performance of Compensation Method in Accordance with an Embodiment of the Present Invention Table 1 shows the Perceptual Evaluation of Speech Quality (PESQ) score for three different methods for handling CVSD decoder state divergence: a re-encoding method such as that described above in Section C, no approach at all (denoted "No Re-encoding"), and a compensation method such as that described in Sections D and E (denoted "No Re-encoding+Memory Compensation"). The relative performance of each method was tested for a typical operating point with 3% of the frames corrupted by bursty bit errors.

TABLE 1

| Performance of CVSD Memory Compensation with 3% Frame Corruption | |
|---|---|
| Method | PESQ |
| Re-encoding | 3.223 |
| No Re-encoding | 3.113 |
| No Re-encoding + Memory Compensation | 3.222 |

It can be seen from the table that the compensation scheme achieves essentially equivalent quality to using full re-encoding, and provides a significant improvement over not performing any correction or compensation of the decoder memory. The improvement of 0.109 PESQ is a very audible and significant quality improvement.

F. Example Computer System Implementation

Depending upon the implementation, various elements of system 500 (described above in reference to FIGS. 5 and 6) as well as various steps described above in reference to flowchart 700 of FIG. 7 may be implemented in hardware using analog and/or digital circuits, in software, through the execution of instructions by one or more general purpose or special-purpose processors, or as a combination of hardware and software. An example of a computer system 800 that may be used to execute certain software-implemented features of these systems and methods is depicted in FIG. 8.

Figure 8:
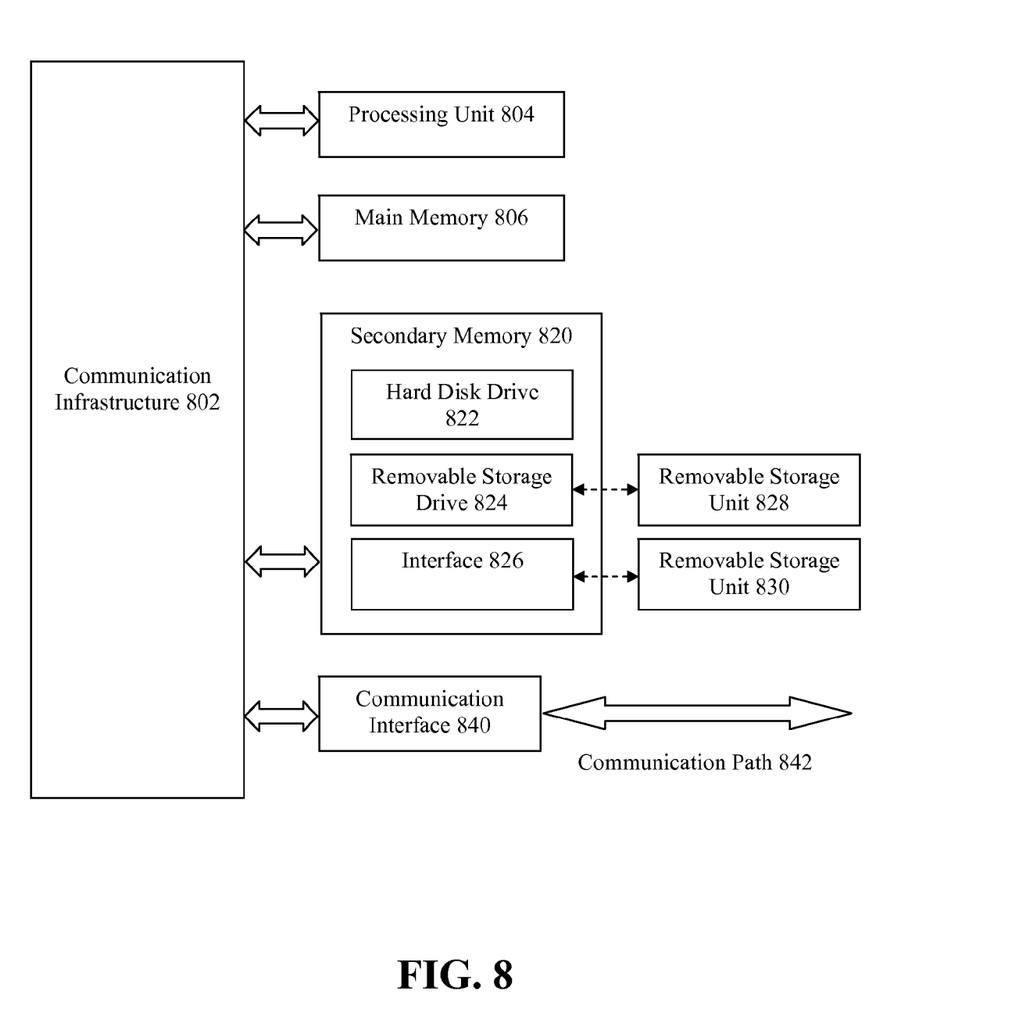
FIG. 8 is a block diagram of an example computer system that may be used to implement features of the present invention.

As shown in FIG. 8, computer system 800 includes a processing unit 804 that includes one or more processors. Processor unit 804 is connected to a communication infrastructure 802, which may comprise, for example, a bus or a network.

Computer system 800 also includes a main memory 806, preferably random access memory (RAM), and may also include a secondary memory 820. Secondary memory 820 may include, for example, a hard disk drive 822, a removable storage drive 824, and/or a memory stick. Removable storage drive 824 may comprise a floppy disk drive, a magnetic tape drive, an optical disk drive, a flash memory, or the like. Removable storage drive 824 reads from and/or writes to a removable storage unit 728 in a well-known manner. Removable storage unit 828 may comprise a floppy disk, magnetic tape, optical disk, or the like, which is read by and written to by removable storage drive 824. As will be appreciated by persons skilled in the relevant art(s), removable storage unit 828 includes a computer usable storage medium having stored therein computer software and/or data.

In alternative implementations, secondary memory 820 may include other similar means for allowing computer programs or other instructions to be loaded into computer system 800. Such means may include, for example, a removable storage unit 830 and an interface 826. Examples of such means may include a program cartridge and cartridge interface (such as that found in video game devices), a removable memory chip (such as an EPROM, or PROM) and associated socket, and other removable storage units 830 and interfaces 826 which allow software and data to be transferred from the removable storage unit 830 to computer system 800.

Computer system 800 may also include a communication interface 840. Communication interface 840 allows software and data to be transferred between computer system 800 and external devices. Examples of communication interface 840 may include a modem, a network interface (such as an Ethernet card), a communications port, a PCMCIA slot and card, or the like. Software and data transferred via communication interface 840 are in the form of signals which may be electronic, electromagnetic, optical, or other signals capable of being received by communication interface 840. These signals are provided to communication interface 840 via a communication path 842. Communications path 842 carries signals and may be implemented using wire or cable, fiber optics, a phone line, a cellular phone link, an RF link and other communications channels.

As used herein, the terms "computer program medium" and "computer readable medium" are used to generally refer to media such as removable storage unit 828, removable storage unit 830 and a hard disk installed in hard disk drive 822. Computer program medium and computer readable medium can also refer to memories, such as main memory 806 and secondary memory 820, which can be semiconductor devices (e.g., DRAMs, etc.). These computer program products are means for providing software to computer system 800.

Computer programs (also called computer control logic, programming logic, or logic) are stored in main memory 806 and/or secondary memory 820. Computer programs may also be received via communication interface 840. Such computer programs, when executed, enable computer system 800 to implement features of the present invention as discussed herein. Accordingly, such computer programs represent controllers of computer system 800. Where the invention is implemented using software, the software may be stored in a computer program product and loaded into computer system 800 using removable storage drive 824, interface 826, or communication interface 840.

The invention is also directed to computer program products comprising software stored on any computer readable medium. Such software, when executed in one or more data processing devices, causes a data processing device(s) to operate as described herein. Embodiments of the present invention employ any computer readable medium, known now or in the future. Examples of computer readable mediums include, but are not limited to, primary storage devices (e.g., any type of random access memory) and secondary storage devices (e.g., hard drives, floppy disks, CD ROMS, zip disks, tapes, magnetic storage devices, optical storage devices, MEMs, nanotechnology-based storage device, etc.).

G. Conclusion

While various embodiments of the present invention have been described above, it should be understood that they have been presented by way of example only, and not limitation. It will be understood by those skilled in the relevant art(s) that various changes in form and details may be made to the embodiments of the present invention described herein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A method for compensating for the effects of a diverged state of an audio decoder on a decoded audio signal generated by the audio decoder, the audio decoder being configured to generate the decoded audio signal in accordance with a variable step size, the method comprising:

calculating a first estimated step size associated with a first frame of the decoded audio signal;

calculating a second estimated step size associated with a replacement frame generated to conceal bit errors detected in the first frame of the decoded audio signal; and modifying a second frame of the decoded audio signal based on the first estimated step size and the second estimated step size.

2. The method of claim 1, wherein the audio decoder comprises a Continuously Variable Slope Delta Modulation (CVSD) audio decoder.

3. The method of claim 2, further comprising:

generating the decoded audio signal by the CVSD decoder, wherein generating the decoded audio signal comprises down-sampling a 64 kHz decoded audio signal to produce an 8 kHz decoded audio signal.

4. The method of claim 1, wherein calculating the first estimated step size comprises calculating an estimate of a step size maintained by the audio decoder following generation of a last sample in the first frame of the decoded audio signal, and wherein calculating the second estimated step size comprises calculating an estimate of a step size maintained by a hypothetical audio decoder following generation of a last sample in the replacement frame.

5. The method of claim 1, wherein modifying the second frame of the decoded audio signal based on the first estimated step size and the second estimated step size comprises calculating a series of output samples in accordance with:

$$\text{out}_{mc}(n) = \text{out}(n) \cdot \lambda(n), \text{ for } n = 0 \ldots FRSZ-1$$

wherein $\text{out}_{mc}(n)$ represents a modified sample of the second frame of the decoded audio signal, $\text{out}(n)$ represents an unmodified sample of the second frame of the decoded audio signal, FRSZ represents a number of samples in the second frame of the decoded audio signal, $$\lambda(0) = \frac{\delta e_c}{\delta e_{be}}$$

and $\lambda(n+1) = (1-SSATT) + \lambda(n) \cdot SSATT$, and wherein $\lambda(n)$ is a compensation factor associated with sample n of the second frame of the decoded audio signal, $\delta e_{be}$ represents the first estimated step size, $\delta e_c$ represents the second estimated step size, $SSATT \cong \beta^8$, and $$\beta = \frac{1023}{1024}.$$

6. The method of claim 5, further comprising modifying one or more subsequent frames of the decoded audio signal by calculating, for each series of samples corresponding to a subsequent frame of the decoded audio signal, a series of output samples in accordance with:

$$\text{out}_{mc}(n) = \text{out}(n) \cdot \lambda(n), \text{ for } n=0 \ldots FRSZ-1$$

wherein $\text{out}_{mc}(n)$ represents a modified sample of the subsequent frame of the decoded audio signal, out(n) represents an unmodified sample of the subsequent frame of the decoded audio signal, FRSZ represents a number of samples in the subsequent frame of the decoded audio signal, $\lambda(0)$ is a compensation factor associated with a last sample of a previous frame of the decoded audio signal, and $\lambda(n+1) = (1-SSATT) + \lambda(n) \cdot SSATT$, wherein $SSATT \cong \beta^8$, and $$\beta = \frac{1023}{1024}.$$

7. The method of claim 1, further comprising:
detecting the bit errors in the first frame of the decoded audio signal; and
generating the replacement frame to conceal the bit errors in the first frame of the decoded audio signal.

8. The method of claim 7, further comprising:
performing at least the modification step responsive to detecting the bit errors in the first frame of the decoded audio signal.

9. A system comprising:
an audio decoder configured to generate a decoded audio signal in accordance with a variable step size; and
a first step size estimator configured to calculate a first estimated step size associated with a first frame of the decoded audio signal;
a second step size estimator configured to calculate a second estimated step size associated with a replacement frame generated to conceal bit errors in the first frame of the decoded audio signal; and
a compensator configured to modify a second frame of the decoded audio signal based on the first estimated step size and the second estimated step size.

10. The system of claim 9, wherein the audio decoder comprises a Continuously Variable Slope Delta Modulation (CVSD) audio decoder.

11. The system of claim 10, wherein the CVSD audio decoder is configured to generate the decoded audio signal by down-sampling a 64 kHz decoded audio signal to produce an 8 kHz decoded audio signal.

12. The system of claim 9, wherein the first step size estimator is configured to calculate the first estimated step size by calculating an estimate of a step size maintained by the audio decoder following generation of a last sample in the first frame of the decoded audio signal, and
wherein the second step size estimator is configured to calculate the second estimated step size by calculating an estimate of a step size maintained by a hypothetical audio decoder following generation of a last sample in the replacement frame.

13. The system of claim 9, wherein the compensator is configured to modify the second frame of the decoded audio signal based on the first estimated step size and the second estimated step size by calculating a series of output samples in accordance with:

$$\text{out}_{mc}(n) = \text{out}(n) \cdot \lambda(n), \text{ for } n=0 \ldots FRSZ-1$$

wherein $\text{out}_{mc}(n)$ represents a modified sample of the second frame of the decoded audio signal, out(n) represents an unmodified sample of the second frame of the decoded audio signal, FRSZ represents a number of samples in the second frame of the decoded audio signal, $$\lambda(0) = \frac{\delta e_c}{\delta e_{be}}$$

and $\lambda(n+1) = (1-SSATT) + \lambda(n) \cdot SSATT$, and wherein $\lambda(n)$ is a compensation factor associated with sample n of the second frame of the decoded audio signal, $\delta e_{be}$ represents the first estimated step size, $\delta e_c$ represents the second estimated step size, $SSATT \cong \beta^8$, and $$\beta = \frac{1023}{1024}.$$

14. The system of claim 13, wherein the compensator is further configured to modify one or more subsequent frames of the decoded audio signal by calculating, for each series of samples corresponding to a subsequent frame of the decoded audio signal, a series of output samples in accordance with:

$$\text{out}_{mc}(n) = \text{out}(n) \cdot \lambda(n), \text{ for } n=0 \ldots FRSZ-1$$

wherein $\text{out}_{mc}(n)$ represents a modified sample of the subsequent frame of the decoded audio signal, out(n) represents an unmodified sample of the subsequent frame of the decoded audio signal, FRSZ represents a number of samples in the subsequent frame of the decoded audio signal, $\lambda(n)$ is a compensation factor associated with a last sample of a previous frame of the decoded audio signal, and $\lambda(n+1) = (1-SSATT) + \lambda(n) \cdot SSATT$, wherein $SSATT \cong \beta^8$, and $$\beta = \frac{1023}{1024}.$$

15. The system of claim 9, further comprising:
a bit error detection and concealment block configured to detect the bit errors in the first frame of the decoded audio signal and to generate the replacement frame to conceal the bit errors in the first frame of the decoded audio signal.

16. The system of claim 15, wherein the compensator is configured to modify the second frame of the decoded audio signal based on the first estimated step size and the second estimated step size responsive to the detection of the bit errors in the first frame of the decoded audio signal.

17. A computer program product comprising a computer-readable storage device having computer program logic recorded thereon for enabling a processing unit to compensate for the effects of a diverged state of an audio decoder on a decoded audio signal generated by the audio decoder, the audio decoder being configured to generate the decoded audio signal in accordance with a variable step size, the computer program logic comprising:
first means for enabling the processing unit to calculate a first estimated step size associated with a first frame of the decoded audio signal;
second means for enabling the processing unit to calculate a second estimated step size associated with a replacement frame generated to conceal bit errors detected in the first frame of the decoded audio signal; and
third means for enabling the processing unit to modify a second frame of the decoded audio signal based on the first estimated step size and the second estimated step size.

18. The computer program product of claim 17, wherein the audio decoder comprises a Continuously Variable Slope Delta Modulation (CVSD) audio decoder.

19. The computer program product of claim 17, wherein the first means comprises means for enabling the processing unit to calculate an estimate of a step size maintained by the audio decoder following generation of a last sample in the first frame of the decoded audio signal, and
wherein the second means comprises means for enabling the processing unit to calculate an estimate of a step size maintained by a hypothetical audio decoder following generation of a last sample in the replacement frame.

20. The computer program product of claim 17, wherein the third means comprises means for enabling the processing unit to calculate a series of output samples in accordance with:

$$out_{mc}(n) = out(n) \cdot \lambda(n), \text{ for } n=0 \ldots FRSZ-1$$

wherein $out_{mc}(n)$ represents a modified sample of the second frame of the decoded audio signal, $out(n)$ represents an unmodified sample of the second frame of the decoded audio signal, FRSZ represents a number of samples in the second frame of the decoded audio signal, $$\lambda(0) = \frac{\delta e_c}{\delta e_{be}}$$

and $\lambda(n+1) = (1-SSATT) + \lambda(n) \cdot SSATT$, and wherein $\lambda(n)$ is a compensation factor associated with sample n of the second frame of the decoded audio signal, $\delta e_{be}$ represents the first estimated step size, $\delta e_c$ represents the second estimated step size, $SSATT \cong \beta^8$, and $$\beta = \frac{1023}{1024}.$$

21. The computer program product of claim 20, wherein the third means further comprises means for enabling the processing unit to modify one or more subsequent frames of the decoded audio signal by calculating, for each series of samples corresponding to a subsequent frame of the decoded audio signal, a series of output samples in accordance with:

$$out_{mc}(n) = out(n) \cdot \lambda(n), \text{ for } n=0 \ldots FRSZ-1$$

wherein $out_{mc}(n)$ represents a modified sample of the subsequent frame of the decoded audio signal, $out(n)$ represents an unmodified sample of the subsequent frame of the decoded audio signal, FRSZ represents a number of samples in the subsequent frame of the decoded audio signal, $\lambda(n)$ is a compensation factor associated with a last sample of a previous frame of the decoded audio signal, and $\lambda(n+1) = (1-SSATT) + \lambda(n) \cdot SSATT$, wherein $SSATT \cong \beta^8$, and $$\beta = \frac{1023}{1024}.$$

22. The computer program product of claim 17, wherein the computer program logic further comprises:
fourth means for enabling the processing unit to detect the bit errors in the first frame of the decoded audio signal and to generate the replacement frame to conceal the bit errors in the first frame of the decoded audio signal.

23. The computer program product of claim 22, wherein the third means comprises means for enabling the processing unit to modify the second frame of the decoded audio signal based on the first estimated step size and the second estimated step size responsive to the detection of the bit errors in the first frame of the decoded audio signal by the fourth means.

* * * * *